(12) United States Patent
Nomura et al.

(10) Patent No.: US 10,976,352 B2
(45) Date of Patent: Apr. 13, 2021

(54) CURRENT SENSOR AND MEASUREMENT DEVICE

(71) Applicant: HIOKI E.E. CORPORATION, Ueda (JP)

(72) Inventors: Atsushi Nomura, Ueda (JP); Shunsuke Suzuki, Ueda (JP)

(73) Assignee: HIOKI E.E. Corporation, Ueda (JP)

( * ) Notice: Subject to any disclaimer, the term of this patent is extended or adjusted under 35 U.S.C. 154(b) by 29 days.

(21) Appl. No.: 16/390,353

(22) Filed: Apr. 22, 2019

(65) Prior Publication Data

US 2019/0346486 A1    Nov. 14, 2019

(30) Foreign Application Priority Data

May 9, 2018    (JP) .............................. JP2018-090622

(51) Int. Cl.
     *G01R 15/18*      (2006.01)
     *G01R 19/00*      (2006.01)

(52) U.S. Cl.
     CPC ....... *G01R 15/181* (2013.01); *G01R 19/0092* (2013.01)

(58) Field of Classification Search
     CPC ... G01R 15/181; G01R 19/0092; G01R 35/02
     See application file for complete search history.

(56) References Cited

U.S. PATENT DOCUMENTS

| 8,198,885 | B2 * | 6/2012 | Sorensen | G01R 15/181 |
| | | | | 324/126 |
| 9,541,581 | B2 * | 1/2017 | Ringsrud | G01R 15/202 |
| 9,606,146 | B2 * | 3/2017 | Bannister | G01R 19/0092 |
| 10,054,615 | B2 * | 8/2018 | Schneider | G01R 1/04 |
| 10,345,342 | B2 * | 7/2019 | Gotz | G01R 15/247 |
| 2006/0082356 | A1 * | 4/2006 | Zhang | G01R 15/181 |
| | | | | 324/117 R |
| 2016/0116506 | A1 * | 4/2016 | Ringsrud | G01R 19/0092 |
| | | | | 324/251 |

FOREIGN PATENT DOCUMENTS

JP      4-118667 U    10/1992

\* cited by examiner

*Primary Examiner* — Dominic E Hawkins
(74) *Attorney, Agent, or Firm* — Jordan IP Law, LLC

(57) ABSTRACT

A current sensor configured to detect electric current flowing through an object to be measured in a state where the current sensor encloses the object to be measured includes a coil body configured to detect the electric current flowing through the object to be measured, and a holding portion to which a base end portion of the coil body is attached, the holding portion being configured to insert and hold a leading end 1*a* of the coil body in an insertion port. A part having a greater curvature than a curvature of the base end portion is formed in a leading end portion having the leading end of the coil body.

11 Claims, 5 Drawing Sheets

CURRENT SENSOR AND MEASUREMENT DEVICE

CROSS-REFERENCE TO RELATED APPLICATION

The present application claims priority 35 U.S.C. § 119 to Japanese Patent Publication No. JP 2018-090622 (filed on May 9, 2018), which is hereby incorporated by reference in its entirety.

TECHNICAL FIELD

The present invention relates to a current sensor and a measurement device configured to detect electric current flowing through an object to be measured.

BACKGROUND ART

JP1992-118667U discloses a Rogowski coil capable of being warped in a ring shape by including a flexible tube having flexibility as a current sensor used to measure electric current.

SUMMARY OF INVENTION

In order to enclose an object to be measured by using the current sensor as described above, after letting a leading end of the current sensor through to the back of the object to be measured, a user has to bring a hand or tweezers, etc. to the back of the object to be measured and pull out the leading end of the current sensor to the front of the object to be measured. However, in a case where a gap between the object to be measured and another member adjacent to the object is narrow, a hand or tweezers, etc. cannot be or is not easily brought to the back of the object to be measured. In such a situation, it is difficult to pull out the leading end of the current sensor to the front from the back of the object to be measured.

Further, after the current sensor is let through to the front from the back of the object to be measured, there is a need for enclosing the entire circumference of the object to be measured by the current sensor. Thus, for example, in a situation where an electronic part exists around the object to be measured, it is not easy to enclose the object to be measured by the current sensor.

The present invention is achieved focusing on such a problem, and an object thereof is to easily enclose an object to be measured even in a situation where a hand cannot be or is not easily brought to the back of the object to be measured.

According to an aspect of the present invention, a current sensor configured to detect electric current flowing through an object to be measured in a state where the current sensor encloses the object to be measured includes a coil body configured to detect the electric current flowing through the object to be measured, and a holding portion to which a base end portion of the coil body is attached, the holding portion being configured to insert and hold a leading end of the coil body in an insertion port. A part having a greater curvature than a curvature of the base end portion of the coil body is formed in a leading end portion having the leading end of the coil body.

According to this aspect, the curvature of the leading end portion of the coil body is greater than the curvature of the base end portion. Thus, by a user operating the holding portion of the current sensor, it becomes easier to take out the leading end of the coil body from the back of the object to be measured. Therefore, it becomes easier to enclose the object to be measured by the current sensor even in a situation where a hand or tweezers, etc. cannot be or is not easily brought to the back of the object to be measured.

DESCRIPTION OF EMBODIMENTS

Hereinafter, embodiments of the present invention will be described with reference to the attached drawings.

First Embodiment

Figure 1:
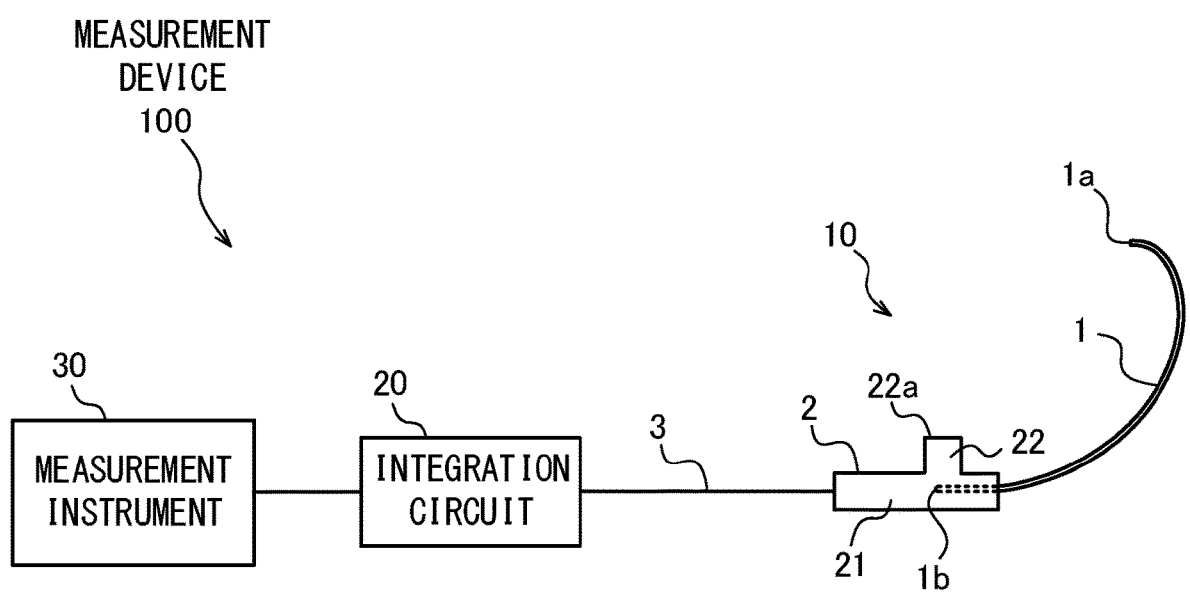
FIG. 1 is a view showing a configuration of a measurement device including a current sensor in a first embodiment of the present invention.

FIG. 1 is a view showing a configuration of a measurement device 100 in a first embodiment.

The measurement device 100 includes a current sensor 10 configured to detect electric current flowing through an object to be measured, an integration circuit 20 configured to integrate a detection signal outputted from the current sensor 10, and a measurement instrument 30 configured to measure a physical amount of the object to be measured on a basis of a signal outputted from the integration circuit 20. The integration circuit 20 and the measurement instrument 30 constitute a measurement portion configured to measure a physical amount of the object to be measured based on a detection signal outputted by the current sensor 10. The object to be measured includes a power source line through which alternating current flows, or a terminal of an electronic part mounted on a substrate. The physical amount of the object to be measured includes a value of alternating current flowing through the object to be measured, a value of AC electric power, or a value of AC magnetic field generated around the object to be measured, etc.

The current sensor 10 detects the alternating current flowing through the object to be measured in a state where the current sensor 10 encloses the object to be measured. The current sensor 10 includes a coil body 1 capable of detecting the alternating current flowing through the object to be measured, and a holding portion 2 to which a base end 1b of the coil body 1 is attached, the holding portion being capable of inserting and holding a leading end 1a of the coil body 1 in an insertion port 22a.

The coil body 1 is formed in a curved shape in advance in order to easily enclose the object to be measured. The coil body 1 has flexibility. Thereby, the coil body 1 can be warped at the time of enclosing the object to be measured. Further, the coil body 1 has elasticity. Thereby, when external force applied to the coil body 1 is removed, the coil body 1 is restored to the original shape or the substantially original shape.

In the coil body 1, a conductive wire is wound around a hollow flexible member having an insulating property in a spiral shape. The flexible member is made of, for example, synthetic resin such as vinyl chloride or polyethylene. The wound conductive wire is folded at the leading end 1a of the coil body 1, passes through the inside of the hollow flexible member, and extends to the base end 1b of the coil body 1.

In the present embodiment, the coil body 1 is formed by a Rogowski coil type current sensor having flexibility. The entire coil body 1 is covered with a resin material such as fluorine resin. Thereby, at the time of enclosing the object to be measured by the coil body 1, it is possible to prevent a scratch on the coil body 1 due to hooking of the coil body 1 onto the object to be measured, or another adjacent member adjacent to the object.

The holding portion 2 is an operation part to be operated by a hand or fingers of a user. The holding portion 2 includes a fixing portion 21 configured to fix part of the coil body 1, and an insertion portion 22 in which the leading end 1a of the coil body 1 is inserted into the insertion port 22a by the user at the time of enclosing the object to be measured by the coil body 1.

By inserting the leading end 1a of the coil body 1 into the insertion portion 22, the current sensor 10 is brought into a closed state. On the contrary, by pulling the leading end 1a of the coil body 1 out of the insertion portion 22, the current sensor 10 is brought into an opened state. Inside the fixing portion 21, the base end 1b of the coil body 1 and a cable 3 of the integration circuit 20 are electrically connected to each other.

The integration circuit 20 converts a detection signal indicating voltage induced by the conductive wire of the coil body 1 into a signal proportional to amplitude of electric current flowing through the object to be measured. The integration circuit 20 outputs the converted signal to the measurement instrument 30 as a detection signal.

The measurement instrument 30 measures the physical amount of the object to be measured on a basis of the detection signal from the integration circuit 20. For example, when receiving the detection signal from the integration circuit 20, the measurement instrument 30 measures the alternating current flowing through the object to be measured on a basis of the detection signal. The measurement instrument 30 may measure the AC electric power or strength of the magnetic field and the like on a basis of the received detection signal as other physical amounts. The measurement instrument 30 displays a waveform of the measured physical amount on a screen. The measurement instrument 30 is formed by, for example, an oscilloscope, a power meter, or, a current meter, etc.

Next, a use mode of the current sensor 10 in the present embodiment will be described with reference to FIGS. 2 and 3.

Figure 2:
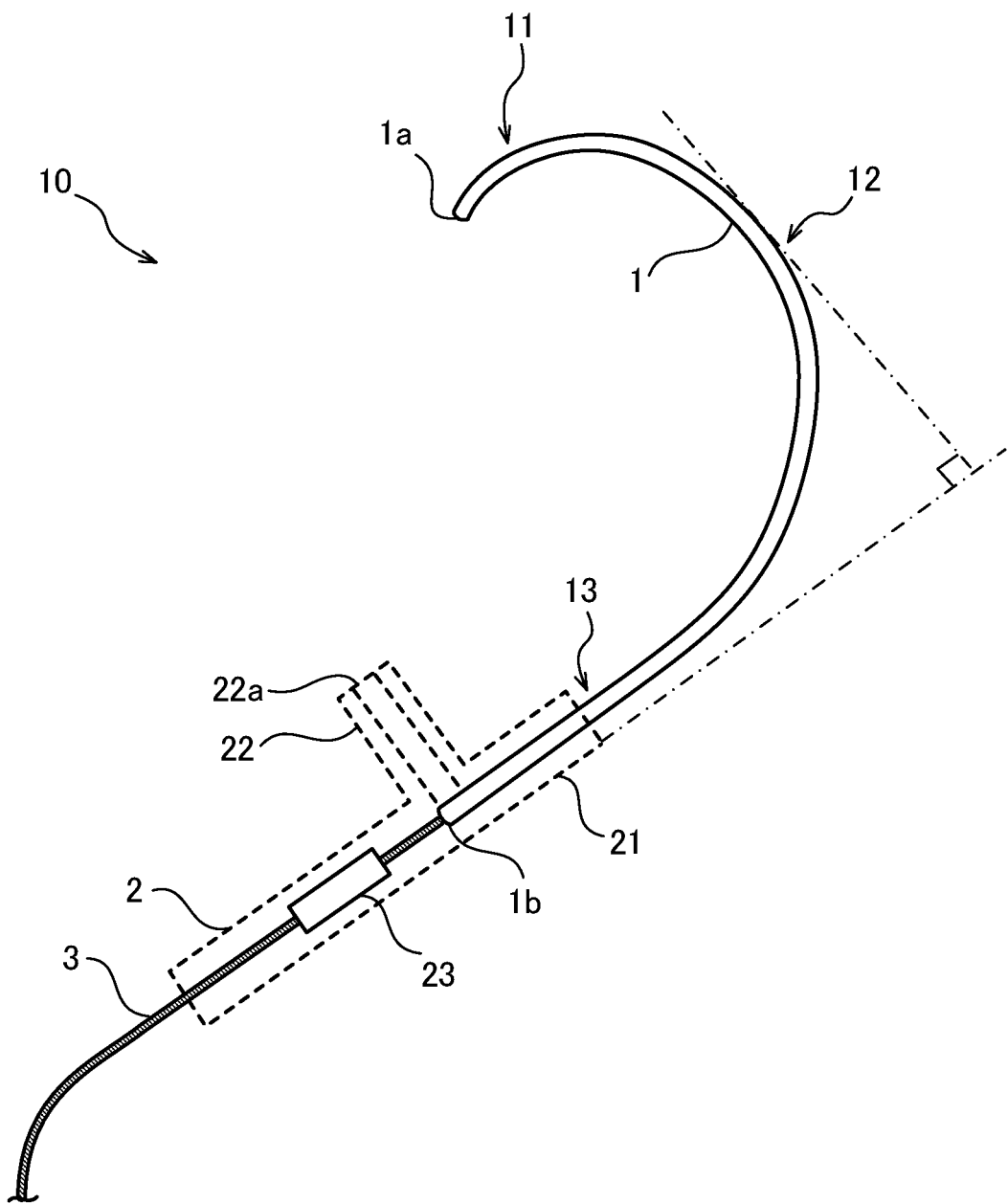
FIG. 2 is a view showing a configuration of the current sensor in the present embodiment.

FIG. 2 is a view showing a shape of the coil body 1 in a state where the current sensor 10 is opened. A matching circuit 23 for matching impedance on the coil body 1 side with impedance on the measurement instrument 30 side is arranged inside the holding portion 2.

In a state where the current sensor 10 is opened, a part having a greater curvature than a curvature of a base end portion 13 having the base end 1b of the coil body 1 is formed in a leading end portion 11 of the coil body 1. The leading end portion 11 is a part including the leading end 1a of the coil body 1, the part having particular length. In the leading end portion 11, a curvature of the leading end 1a may be the greatest, or the leading end 1a may have no curvature and a curvature of another part may be greater than the curvature of the base end portion 13.

In the present embodiment, the leading end portion 11 of the coil body 1 is curved inward and toward the insertion port 22a in advance in such a manner that the leading end 1a of the coil body 1 passing through the back of the object to be measured comes to the front of a front surface of the object to be measured. Therefore, the coil body 1 is formed in a curve in such a manner that any tangent line of an intermediate portion 12 positioned between the leading end portion 11 and the base end portion 13 of the coil body 1 is orthogonal to a straight line extending in the extension direction of the fixing portion 21.

The base end portion 13 of the coil body 1 is formed in a linear shape in such a manner that at the time of pushing the holding portion 2 toward the object to be measured by fingers of the user, force of pushing is easily transmitted to the intermediate portion 12 of the coil body 1. Further, the intermediate portion 12 of the coil body 1 is formed to have a curvature greater than the curvature of the base end portion 13 of the coil body 1 and smaller than the curvature of the leading end portion 11 in such a manner that the coil body 1 is less easily hooked onto an edge of an adjacent member of the object to be measured.

In such a way, in the coil body 1, the curvature of the coil body 1 is stepwise or continuously gradually increased from the base end portion 13 to the leading end portion 11. Thereby, force of the user is easily transmitted from the holding portion 2 to the coil body 1 and the coil body 1 is less easily hooked onto the object to be measured or the adjacent member of the object.

In the holding portion 2, part of the base end portion 13 of the coil body 1 is fixed to the fixing portion 21. Regarding the base end portion 13, part of the portion is housed in the fixing portion 21 and the other part is exposed from the fixing portion 21. The insertion portion 22 is formed in such a manner that the leading end 1a of the coil body 1 is abutted with the base end 1b of the coil body 1.

Figure 3:
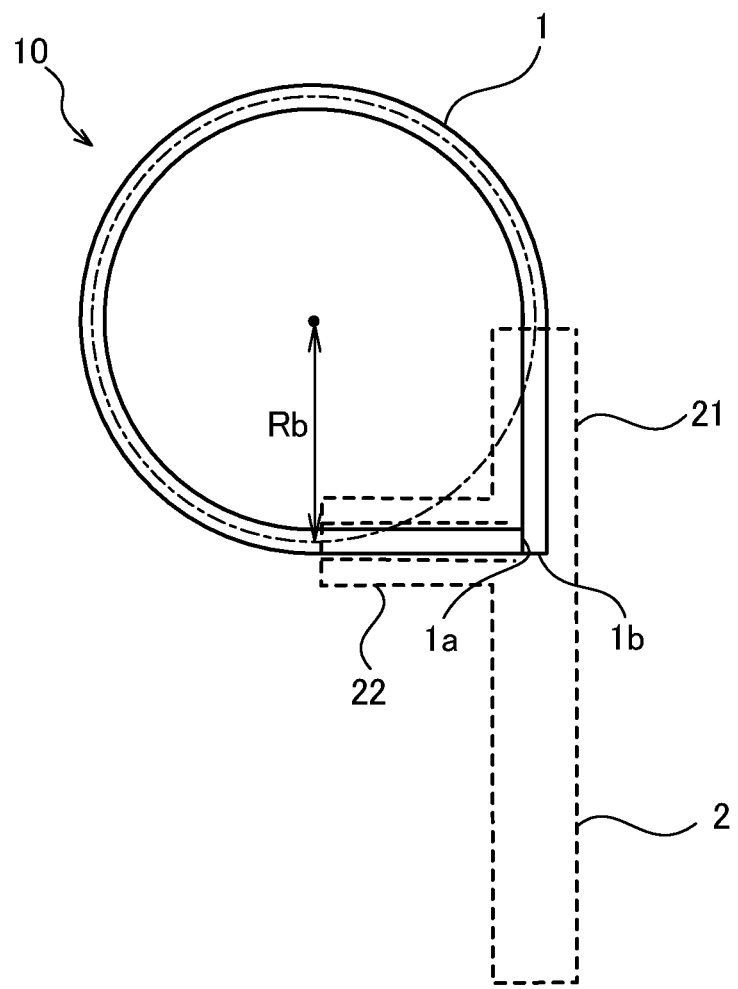
FIG. 3 is a view showing a state where a coil body of the current sensor is closed.

FIG. 3 is a view showing a shape of the coil body 1 in a state where the current sensor 10 is closed. In this figure, both the matching circuit 23 and the cable 3 of the integration circuit 20 shown in FIG. 2 are omitted.

As shown in FIG. 3, by the user inserting the leading end 1a of the coil body 1 into the insertion port 22a of the insertion portion 22, the leading end 1a of the coil body 1 is held by the holding portion 2. Thereby, the current sensor 10 is brought into a closed state, and hence the object to be measured is enclosed by the coil body 1.

Hereinafter, a curvature radius Rb of the coil body 1 in a state where the leading end 1a of the coil body 1 is held in the insertion portion 22 of the holding portion 2 will be referred to as a reference radius, and an inverse of the reference radius (1/Rb) will be referred to as a reference curvature.

When the leading end 1a of the coil body 1 is pulled out of the insertion portion 22 of the holding portion 2 by the user, in the coil body 1 having flexibility, the leading end portion 11 of the coil body 1 is restored to the original inward-curved mode as shown in FIG. 2.

Next, with a terminal (leg) of an electronic part mounted on a substrate serving as the object to be measured, a method of enclosing the terminal of the electronic part by the coil body 1 will briefly be described with reference to FIGS. 4A to 4C.

Figure 4A:
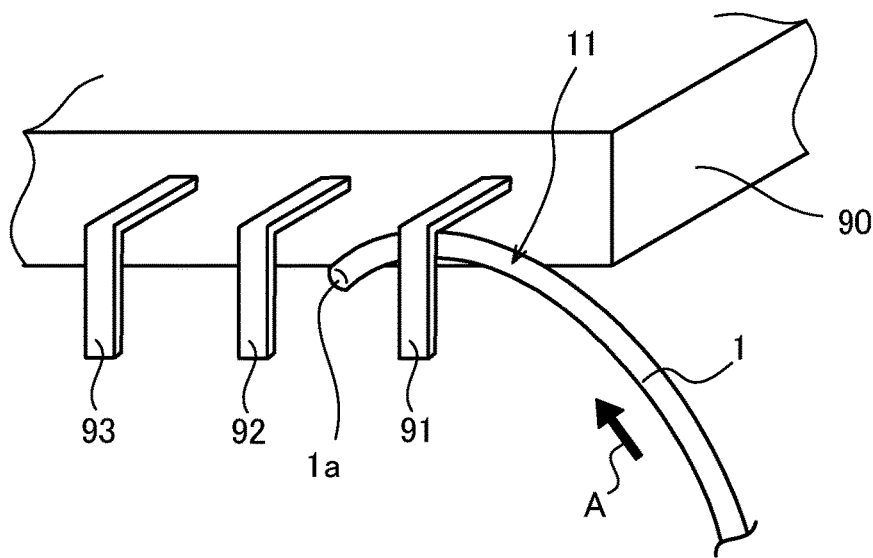
FIG. 4A is a view showing a method of enclosing a terminal of an electronic part by the coil body, the view showing a state where a leading end of the coil body inserted between a side surface of the electronic part and the terminal is directed from the side surface of the electronic part to the terminal between terminals of the electronic part.
Figure 4B:
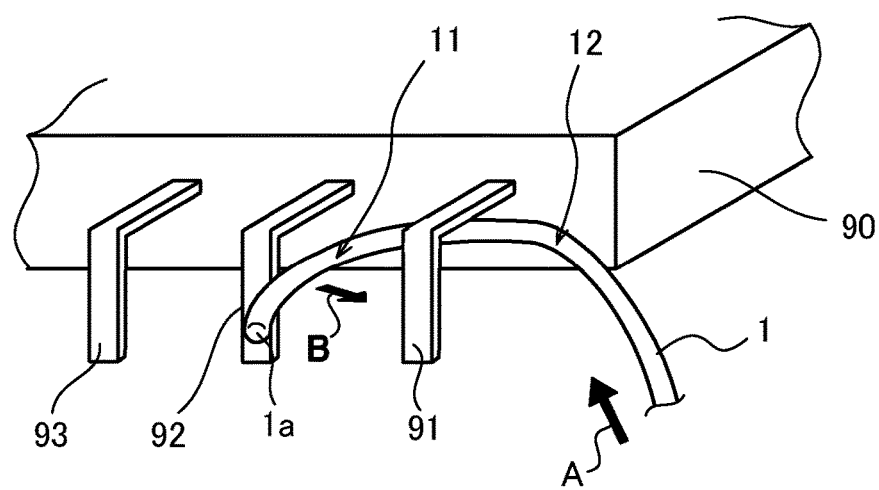
FIG. 4B is a view showing a state where an intermediate portion of the coil body is pressed onto the side surface of the electronic part.
Figure 4C:
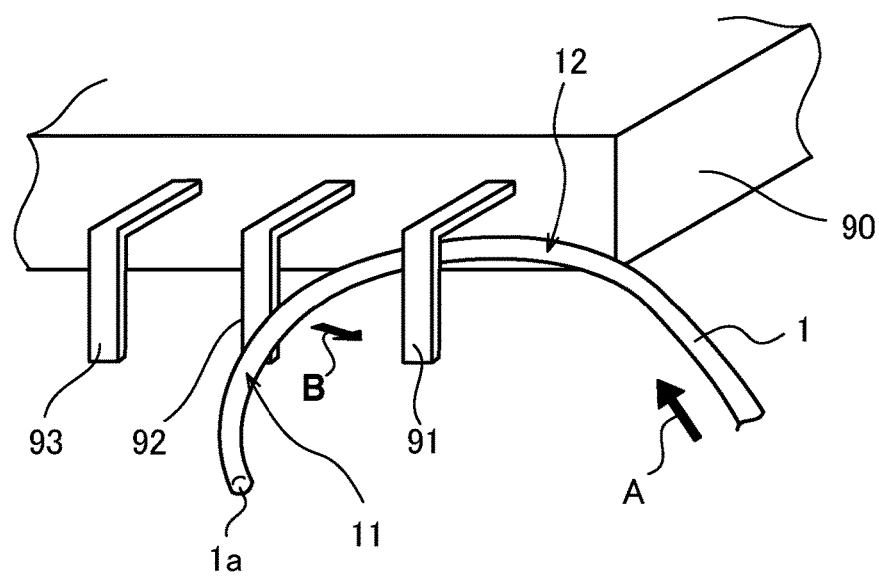
FIG. 4C is a view showing a state where the leading end of the coil body is pushed out to the front of the terminal of the electronic part by further pushing the remaining part of the coil body toward the side surface of the electronic part.

FIGS. 4A to 4C are views for describing a method of feeding the leading end 1a of the coil body 1 from the back to the front of a terminal 91 of an electronic part 90.

In the example shown in FIG. 4, the electronic part 90 includes an electronic part such as an integrated circuit (IC) or a DC/DC converter. A clearance between the terminal 91 and a terminal 92 of the electronic part 90 is about a few mm (millimeters). A diameter of the coil body 1 is not less than 1 mm and not more than 2 mm in such a manner that the coil body comes into the clearance between the terminal 91 and the terminal 92.

As shown in FIG. 4A, by the user moving the holding portion 2 toward the terminal 91 in a state where the holding portion 2 is nipped by fingertips, the leading end 1a of the coil body 1 is inserted between the electronic part 90 and the terminal 91.

At this time, the leading end portion 11 of the coil body 1 is formed to have the curvature not less than the reference curvature (1/Rb) in a state where the current sensor 10 is closed. Thus, when the leading end portion 11 of the coil body 1 is inserted into the back of the terminal 91, it is possible to move the leading end 1a of the coil body 1 in such a manner that the leading end portion 11 of the coil body 1 covers the back of the terminal 91. Therefore, it is possible to suppress a situation that the coil body 1 is hooked onto an edge of the terminal 91 and hence the coil body 1 is scratched.

The leading end portion 11 of the coil body 1 is formed to have the curvature not less than the reference curvature (1/Rb). Thus, the leading end 1a of the coil body 1 passing through the back of the terminal 91 is easily directed from a back surface to a front surface of the terminal 91 with respect to the insertion direction A of the coil body 1. Thereby, the user easily abuts the leading end 1a of the coil body 1 with a side surface of the terminal 92 in order to put the leading end 1a of the coil body 1 to the front of the terminal 91. Therefore, it is possible to let the leading end 1a of the coil body 1 through the narrow clearance between the terminal 92 and the terminal 91 from the back surface to the front surface of the terminal 91.

The curvature radius of the leading end portion 11 of the coil body 1 is preferably smaller than the clearance between the terminal 91 and the terminal 92 of the electronic part 90. In particular, by forming the curvature radius of the leading end portion 11 of not less than 2 mm and not more than 4 mm, it is possible to suppress a situation that the edge of the terminal 91 provided in the electronic part 90 is hooked onto the coil body 1 and hence the coil body 1 is scratched.

Next, as shown in FIG. 4B, the user moves the holding portion 2 further in the insertion direction A in such a manner that the intermediate portion 12 of the coil body 1 is pressed toward the electronic part 90 on the back of the terminal 91.

Thereby, the intermediate portion 12 of the coil body 1 is pressed onto the electronic part 90, and the pressed part serves as a pivot point and the coil body 1 is directed to the inside B. Thus, the coil body 1 is less easily hooked onto edges of the terminals 91 and 92. Thereby, the coil body 1 is less easily scratched.

Further, as shown in FIG. 4C, by the user pushing the holding portion 2 in the insertion direction A, the remaining part of the coil body 1 is fed toward the back of the terminal 91. At this time, a curvature of the intermediate portion 12 of the coil body 1 is smaller than the reference curvature (1/Rb). Thus, while suppressing a situation that the coil body 1 is bent toward the holding portion 2, it is possible to bring the leading end 1a of the coil body 1 close to the insertion port 22a of the holding portion 2.

After that, by the user inserting the leading end 1a of the coil body 1 into the insertion portion 22, the object to be measured is enclosed by the coil body 1. In such a way, with the current sensor 10 of the present embodiment, it is possible to easily enclose the terminal 91 by the coil body 1 even with a hand.

Next, effects and operations of the first embodiment will be described in detail.

According to the present embodiment, the current sensor 10 detects the electric current flowing through the object to be measured in a state where the current sensor 10 encloses the object to be measured. The current sensor 10 includes the coil body 1 configured to detect the electric current flowing through the object to be measured, and the holding portion 2 to which the base end portion 13 of the coil body 1 is attached, the holding portion being configured to insert and hold the leading end 1a of the coil body 1 in the insertion port 22a. The part having the greater curvature than the curvature of the base end portion 13 of the coil body 1 is formed in the leading end portion 11 having the leading end 1a of the coil body 1. The current sensor 10 is included in the measurement device 100. The measurement device 100 further includes the measurement portion configured to measure a physical amount of the object to be measured on a basis of the detection signal outputted by the current sensor 10. The measurement portion includes the integration circuit 20 and the measurement instrument 30.

In such a way, in a state where the leading end 1a of the coil body 1 is not inserted into the insertion port 22a of the holding portion 2, the curvature of the leading end portion 11 of the coil body 1 is greater than the curvature of the base end portion 13. Thus, the leading end 1a of the coil body 1 inserted into the back of the object to be measured is easily directed from the back surface to the front surface of the object to be measured. Thereby, without bringing a hand or tweezers, etc. to the back of the object to be measured, the leading end 1a of the coil body 1 is easily brought to the front of the object to be measured by the user operating the holding portion 2.

Therefore, the user easily pulls the leading end 1a of the coil body 1 to the front of the object to be measured and encloses the object to be measured by the entire coil body 1. That is, according to the present embodiment, even in a situation where the user cannot or does not easily bring a hand to the back of the object to be measured, it is possible to easily enclose the object to be measured by the coil body 1.

In addition to this, the curvature of the base end portion 13 is smaller than the curvature of the leading end portion 11 of the coil body 1. Thus, the user easily moves the leading end 1a of the coil body 1 in the intended direction by applying predetermined force to the holding portion 2. Further, the part having the greater curvature than the curvature of the base end portion 13 is formed in the leading end portion 11 of the coil body 1. Thus, without largely moving the holding portion 2, it is possible to naturally bring the leading end 1a of the coil body 1 close to the insertion port 22a of the holding portion 2. In such a way, the leading end portion 11 and the base end portion 13 of the coil body 1 are formed to have proper curvatures. Thereby, the user can easily enclose the object to be measured by the coil body 1.

According to the present embodiment, the object to be measured of the current sensor 10 includes the terminals 91 to 93 of the electronic part 90 mounted on the substrate as shown in FIG. 4. In this case, the leading end portion 11 of the coil body 1 is formed in such a manner that the leading end 1a of the coil body 1 is directed from the back surface of the terminal 91 to the front surface of the terminal 91 with respect to the insertion direction A in which the coil body 1 is inserted from the holding portion 2 toward the terminal 91.

In such a way, even when a clearance around the terminal 91 serving as the object to be measured is about a few mm, it is possible to bring the leading end 1a of the coil body 1 passing through the back of the terminal 91 to the front of the terminal 91 by the user nipping and operating the holding portion 2 with fingers.

According to the present embodiment, the leading end portion 11 of the coil body 1 is formed to have the curvature equal to or greater than the reference curvature (1/Rb) of the coil body 1 in a state where the leading end 1a of the coil body 1 is held by the holding portion 2. Thereby, the user can, after inserting the leading end 1a of the coil body 1 into the back of the terminal 91 of the electronic part 90, move the leading end 1a of the coil body 1 in such a manner that the leading end covers the back of the terminal 91. Therefore, since the leading end 1a of the coil body 1 is easily directed from the back surface to the front surface of the terminal 91 after inserting the leading end 1a of the coil body 1 into the back of the terminal 91, the user can easily let the leading end pass through between the terminal 91 and the terminal 92.

According to the present embodiment, the coil body 1 is curved in such a manner that the tangent line of the intermediate portion 12 of the coil body 1 is orthogonal to the straight line extending in the extension direction of the fixing portion 21, that is, a tangent line of the base end portion 13 of the coil body 1. Thereby, by performing an operation of pushing the holding portion 2 to the front, the user easily brings the leading end 1a of the coil body 1 to the front of the terminal 91.

According to the present embodiment, the base end portion 13 of the coil body 1 is formed in a linear shape. Thereby, as shown in FIG. 4B, when the user presses the intermediate portion 12 of the coil body 1 onto the side surface of the electronic part 90 serving as the object to be measured and feeding the leading end 1a of the coil body 1 to the front of the terminal 91, the force of the user is easily transmitted from the holding portion 2 to the coil body 1. Therefore, it is possible to suppress a situation that the coil body 1 is excessively curved and hence the force of the user is less easily transmitted to the coil body 1, or a situation that the coil body 1 is curved in the unintended direction.

According to the present embodiment, in the coil body 1, the curvature of the coil body 1 is gradually increased from the base end portion 13 to the leading end portion 11. Thereby, the curvature of the coil body 1 is gradually increased toward the leading end 1a. Thus, the coil body is less easily hooked onto the terminal 91 serving as the object to be measured or the terminal 92 serving as an adjacent member of the object, and it is possible to suppress a situation that transmission of the force from the holding portion 2 to the coil body 1 is lowered. Therefore, while reducing a scratch on the coil body 1, the object to be measured is easily smoothly enclosed by the coil body 1.

According to the present embodiment, the diameter of the coil body 1 is equal to or smaller than 2 mm. Thereby, even when the object to be measured is the terminal 91 provided in the electronic part 90, the user can easily insert the leading end 1a of the coil body 1 into the back of the terminal 91. Further, the user easily lets the leading end 1a of the coil body 1 after insertion through the clearance between the terminal 91 and the terminal 92 from the back of the terminal 91.

According to the present embodiment, the coil body 1 has elasticity. Thus, after the user uses the current sensor 10, the shape of the coil body 1 is restored to the original shape or a shape close to the original shape as shown in FIG. 2. Therefore, the user is not required to perform a task of restoring the shape of the coil body 1 to the original shape every time the current sensor 10 is used. Thus, it is possible to enhance convenience of the current sensor 10.

Second Embodiment

Next, another mode of the current sensor 10 will be described with reference to FIG. 5.

Figure 5:
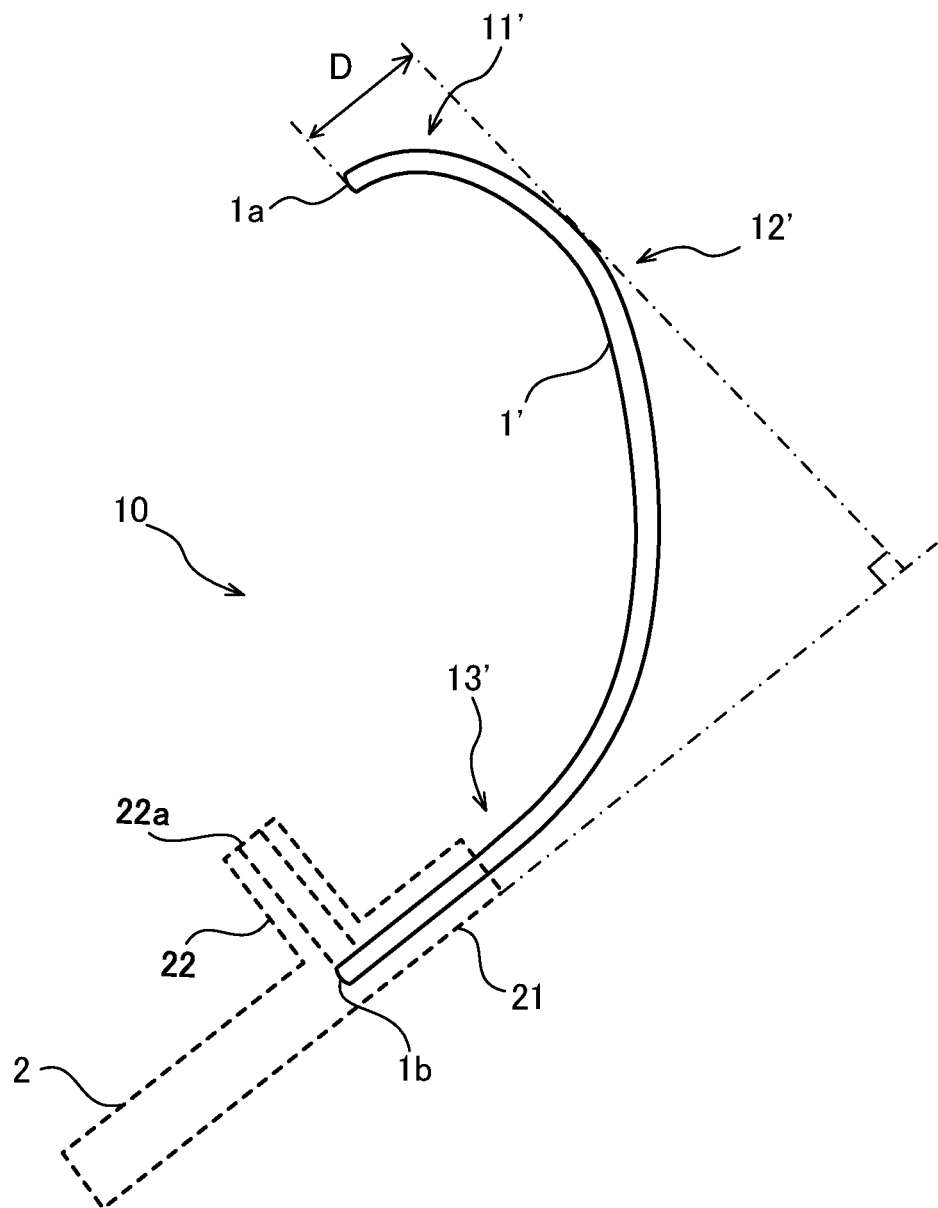
FIG. 5 is a view showing a shape of a current sensor in a second embodiment.

FIG. 5 is a view showing a shape of a current sensor 10 in a second embodiment of the present invention.

As well as the shape of the coil body 1 shown in FIG. 2, a coil body 1' is formed in such a manner that a curvature of a leading end portion 11' is greater than a curvature of a base end portion 13'. Further, the coil body 1' is formed in such a manner that a tangent line of an intermediate portion 12' is orthogonal to a straight line extending in the extension direction of a fixing portion 21.

The coil body 1' of the present embodiment is formed in such a manner that a turn-back distance D from a part where the tangent line of the intermediate portion 12' is orthogonal to a tangent line of the base end portion 13' of the coil body 1' to a leading end 1a of the coil body 1' is smaller than a turn-back distance of the coil body 1 in the first embodiment.

Thereby, in comparison to the coil body 1 of the first embodiment, after letting the leading end 1a of the coil body 1' through between an electronic part 90 and a terminal 91 shown in FIG. 4, the leading end 1a of the coil body 1' is easily abutted with a side surface of a terminal 92. Therefore, the user easily lets the leading end 1a of the coil body 1' through between the terminal 92 and the terminal 91.

According to the present embodiment, the turn-back distance D of the coil body 1' is small. Thus, in a case where a clearance on the back of the terminal 91 serving as the object to be measured is narrow, the leading end 1a of the coil body 1' is easily let through between the terminal 91 and the terminal 92 from a back surface to a front surface of the terminal 91.

The embodiments of the present invention are described above. However, the above embodiments do not intend to limit the technical scope of the present invention to the specific configurations of the above embodiments but only indicate part of application examples of the present invention.

For example, the curvatures of the leading end portion 11, the intermediate portion 12, and the base end portion 13 of the coil body 1 may be fixed or may be serially smaller. The intermediate portion 12 of the coil body 1 may be omitted. Further, the portions of the coil body 1 may be formed to have fixed curvatures and for each portion, length thereof may be set to be one quarter of the circumference of a circle.

The current sensor 10 of the above embodiments can be used even for a circuit substrate in which when an electronic part having plural terminals on a bottom surface is mounted on the substrate, a narrow space is generated between the electronic part and the substrate. Even in such a case, it is possible to easily enclose the terminal of the electronic part by the coil body 1 or 1'.

A shape of the holding portion 2 may be an L shape, a circular shape, or other shapes. For the coil body 1 or 1', not only an elastically deformable material but also a plastically deformable material may be used. Further, the diameter of the coil body 1 or 1' may be less than 1 mm if physically possible.

The present application claims priority based on Japanese Patent Application No. 2018-090622 filed on May 9, 2018, the entire contents of which are incorporated into this specification by reference.

DESCRIPTION OF REFERENCE SIGNS

1: Coil body
1*a*: Leading end
1*b*: Base end
2: Holding portion
10: Current sensor
11: Leading end portion
12: Intermediate portion
13: Base end portion
21: Fixing portion
22: Insertion portion
22*a*: Insertion port
30: Measurement instrument (measurement portion)
90: Electronic part
91: Terminal (object to be measured)
100: Measurement device

What is claimed is:

1. A current sensor configured to detect electric current flowing through an object to be measured in a state where the current sensor encloses the object to be measured, the current sensor comprising:
    a coil body configured to detect the electric current flowing through the object to be measured; and
    a holding portion to which a base end portion of the coil body is attached, the holding portion being configured to insert and hold a leading end of a leading end portion of the coil body in an insertion port of the holding portion, wherein
    the leading end portion having the leading end of the coil body has a first shape in which a part, having a curvature greater than a curvature of the base end portion, is formed, and
    the coil body has elasticity so that the leading end portion is restored from a second shape to the first shape or a shape close to the first shape when external force applied to the coil body is removed.

2. The current sensor according to claim 1, wherein the leading end portion of the coil body is formed to have a curvature greater than a curvature of the coil body in a state where the leading end of the coil body is held by the holding portion.

3. The current sensor according to claim 1, wherein the coil body is curved in such a manner that a tangent line of the base end portion of the coil body is orthogonal to a tangent line of an intermediate portion of the coil body.

4. The current sensor according to claim 1, wherein the base end portion of the coil body is formed in a linear shape.

5. The current sensor according to claim 1, wherein in the coil body, the curvature of the coil body is gradually increased from the base end portion to the leading end portion.

6. The current sensor according to claim 1, wherein a diameter of the coil body is equal to or smaller than 2 mm.

7. A measurement device, comprising:
    the current sensor according to claim 1; and
    a measurement portion configured to measure a physical amount of the object to be measured based on a detection signal outputted by the current sensor.

8. The current sensor according to claim 1, wherein the coil body is restored to the first shape when the external force applied to the coil body is removed.

9. The current sensor according to claim 1, wherein the coil body has flexibility so as to be warped from the first shape to the second shape when the external force is applied to the coil body.

10. A current sensor configured to detect electric current flowing through an object to be measured, the current sensor comprising:
    a coil body configured to detect the electric current flowing through the object to be measured, wherein a leading end portion of the coil body has an original shape having a curvature greater than a curvature of a base end portion of the coil body; and
    a holding portion attached to the base end portion of the coil body, the holding portion including an insertion port configured to releasably receive and hold the leading end portion of the coil body so that the original shape of the leading end portion is warped to a warped shape, wherein the holding portion is configured to release the leading end portion when an external force is applied to the coil body, and
    wherein the coil body has elasticity to be restored to the original shape or a substantially similar shape to the original shape in response to the external force being removed from the coil body.

11. The current sensor according to claim 10, wherein the coil body is restored to the original shape when the external force applied to the coil body is removed.

* * * * *